(12) United States Patent
Kunimoto (10) Patent No.: US 8,110,921 B2
(45) Date of Patent: Feb. 7, 2012

(54) SEMICONDUCTOR PACKAGE AND METHOD OF MANUFACTURING THE SAME

(75) Inventor: Yuji Kunimoto, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 12/616,324

(22) Filed: Nov. 11, 2009

(65) Prior Publication Data
US 2010/0123239 A1 May 20, 2010

(30) Foreign Application Priority Data
Nov. 17, 2008 (JP) .................................. 2008-292987

(51) Int. Cl.
*H01L 23/34* (2006.01)

(52) U.S. Cl. ........................................ 257/724; 257/780

(58) Field of Classification Search .................. 257/780, 257/781, 723, 724, 786
See application file for complete search history.

(56) References Cited

U.S. PATENT DOCUMENTS

| 7,298,030 | B2* | 11/2007 | McWilliams et al. | 257/680 |
| 2005/0067688 | A1* | 3/2005 | Humpston | 257/704 |
| 2005/0087861 | A1* | 4/2005 | Burtzlaff et al. | 257/704 |
| 2009/0218686 | A1* | 9/2009 | Saitou et al. | 257/737 |
| 2009/0250251 | A1* | 10/2009 | Shibata et al. | 174/255 |
| 2010/0078813 | A1* | 4/2010 | Okayama et al. | 257/738 |

FOREIGN PATENT DOCUMENTS
JP 10-223832 8/1998
* cited by examiner

*Primary Examiner* — S. V Clark
(74) *Attorney, Agent, or Firm* — Drinker Biddle & Reath LLP (57) ABSTRACT

A plurality of semiconductor devices having different thicknesses from each other and having respective electrode terminals are fixed on a surface of the support plate through a resin layer in such a manner that terminal surfaces of the electrode terminals are on the level with each other. An insulating layer covers terminal forming surfaces of the semiconductor devices. At least one tapered bump having a tip surface formed in a smaller area than an area of the terminal surface of the electrode terminal of the semiconductor device is formed on one of the terminal surfaces of the electrode terminals and penetrates the insulating layer in such a manner that the tip surface of the tapered bump is exposed to a surface of the insulating layer. A wiring pattern is formed on the surface of the insulating layer and connected to the tip surface of the tapered bump.

10 Claims, 6 Drawing Sheets

SEMICONDUCTOR PACKAGE AND METHOD OF MANUFACTURING THE SAME

This application claims priority to Japanese Patent Application No. 2008-292987, filed Nov. 17, 2008, in the Japanese Patent Office. The Japanese Patent Application No. 2008-292987 is incorporated by reference in its entirety.

TECHNICAL FIELD

The present disclosure relates to a semiconductor package and a method of manufacturing the semiconductor package. More particularly, the present disclosure relates to a semiconductor package provided with a plurality of semiconductor devices and a method of manufacturing the semiconductor package.

RELATED ART

Figure 6:
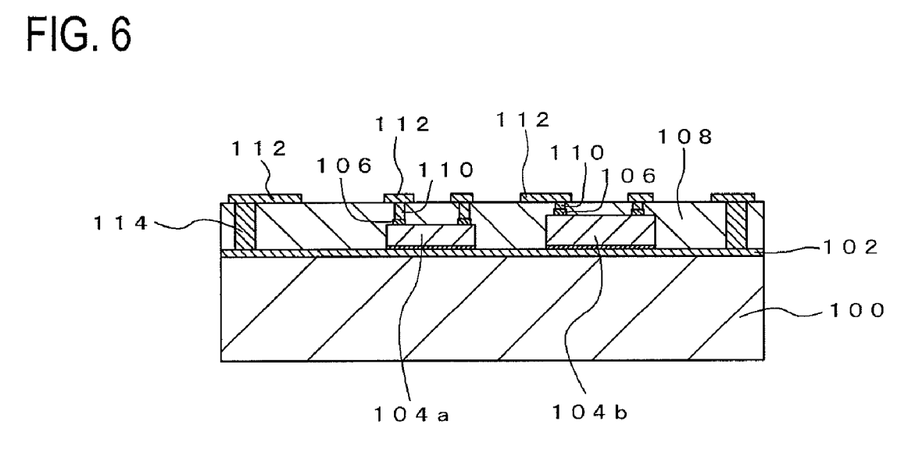
FIG. 6 shows e longitudinal sectional view of a semiconductor package according to a related art.

A semiconductor package provided with a plurality of semiconductor devices has been described in the following Patent Document 1, for example. The semiconductor package is shown in FIG. 6. In the semiconductor package shown in FIG. 6, bottom faces of semiconductor devices 104a and 104b having different thicknesses from each other are bonded to a grounding conductor layer 102 formed on a surface of a base substrate 100. Each of electrode terminals 106 formed on surfaces of the semiconductor devices 104a and 104b is electrically connected to a wiring pattern 112 formed on a surface of an insulating resin layer 108 through a bump 110 penetrating the insulating resin layer 108.

Moreover, the other end of a conductive block 114 having one of ends connected to the conductor layer 102 is electrically connected to the wiring pattern 112 formed on the surface of the insulating resin layer 108.

Figures 7A, 7B:
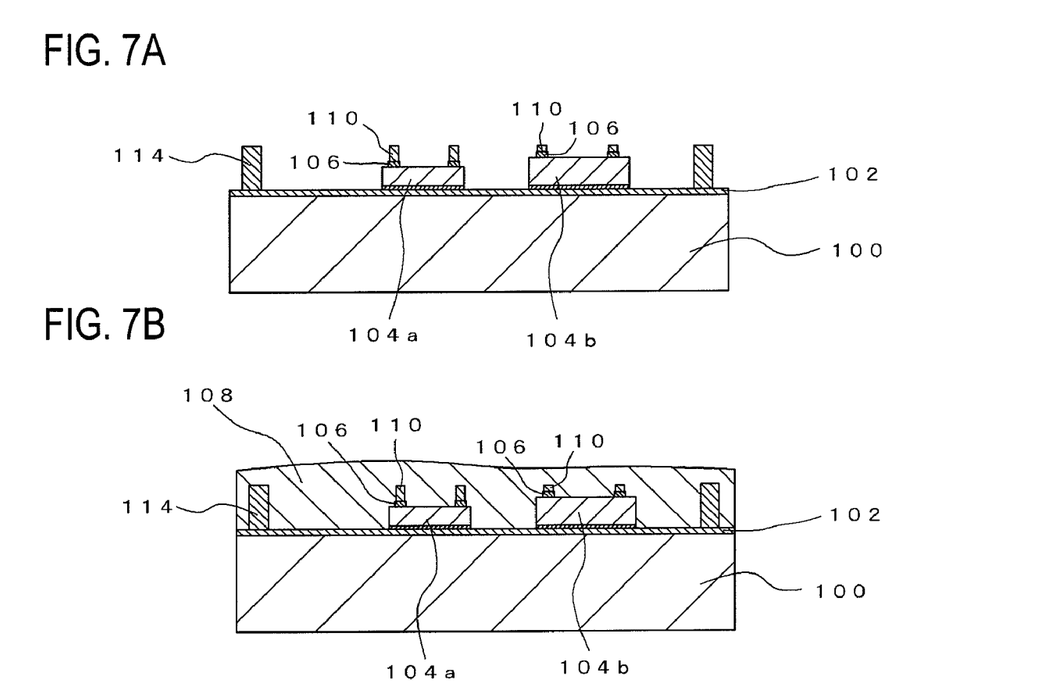
FIGS. 7A to 7C show views for explaining manufacturing processes of the semiconductor package shown in FIG. 6.

The semiconductor package shown in FIG. 6 can be obtained by a manufacturing method illustrated in FIGS. 7A to 7C. As shown in FIG. 7A, first of all, the conductive block 114 is erected on the grounding conductor layer 102 which is formed on the surface of the base substrate 100. The bottom faces of the semiconductor devices 104a and 104b having the different thicknesses from each other are bonded onto the grounding conductor layer 102. The bump 110 having an almost equal diameter to a diameter of the electrode terminal 106 is formed on each of the electrode terminals 106 and 106 provided on the surfaces of the semiconductor devices 104a and 104b. Although respective lengths of the bumps 110 and 110 thus formed are varied depending on the semiconductor devices 104a and 104b, each of tip surfaces of the bumps 110 and 110 is on the level with a tip surface of the conductive block 114.

Figure 7C:
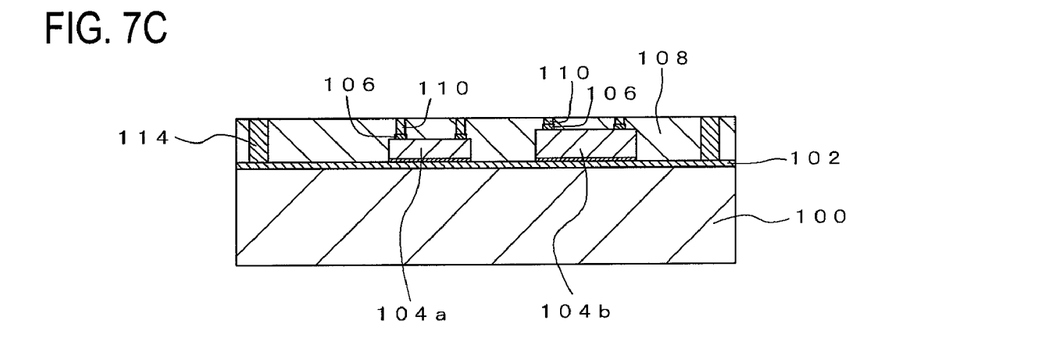

As shown in FIG. 7B, subsequently, the conductive block 114 thus formed and terminal forming surfaces, at which the electrode terminals 106 and 106 are formed, of the semiconductor devices 104a and 104b which include the bump 110 are covered with the insulating resin layer 108 and the surface of the insulating resin layer 108 is then polished or ground to be a flat surface so that tip surfaces of the conductive block 114 and the bump 110 are exposed as shown in FIG. 7C.

Thereafter, the wiring patterns 112 and 112 are formed on the flat surface of the insulating resin layer 108 from which the respective tip surfaces of the conductive block 114 and the bump 110 are exposed. Thus, it is possible to obtain the semiconductor package shown in FIG. 6.

[Patent Document 1] JP-A-10-223832 Publication

In the semiconductor package shown in FIGS. 6 to 7C, it is possible to provide a plurality of semiconductor devices having different thicknesses from each other in the same semiconductor package.

In the semiconductor package shown in FIGS. 6 to 7C, however, the bump 110 having the almost equal diameter to the diameter of the electrode terminal 106 to be formed is provided on each of the electrode terminals 106 and 106 of the semiconductor devices 104a and 104b in such a manner that the tip surfaces of the bumps 110 and 110 are on the level with each other.

On the other hand, in recent years, a forming density of the electrode terminals 106 and 106 has been increased with a reduction in sizes of the semiconductor devices 104a and 104b.

In the semiconductor package shown in FIGS. 6 to 7C, however, the bump 110 having the almost equal diameter to the diameter of the electrode terminal 106 is formed. Therefore, a wiring pattern to be led from the exposed surface of the bump 110 is made fine with difficulty.

In addition, a gap between the exposed surfaces of the adjacent bumps 110 and 110 to each other (which is also referred to as a gap between exposed surfaces of bumps) is small. For this reason, the wiring pattern led from the exposed surface of the bump 110 is made fine with difficulty, and furthermore, the number of the wiring patterns which can be led through the gap between the exposed surfaces of the bumps is remarkably limited so that it is hard to increase a density of the wiring pattern.

In general, it can be supposed to form the resin layer for covering the electrode terminals 106 of the semiconductor devices 104a and 104b and to then form, on the resin layer by a laser, a concave portion for exposing the surface of the electrode terminal 106 to its bottom face, and to thereafter fill the concave portion with a plating metal through electrolytic plating, thereby forming the bump 110 when forming the bumps 110 and 110 having different lengths from each other on the respective electrode terminals 106 of the semiconductor devices 104a and 104b in such a manner that the tip surfaces of the bumps 110 are on the level with each other as in the semiconductor package shown in FIGS. 6 to 7C.

However, the concave portion formed on the resin layer by the laser is usually formed to be a tapered concave portion in which an opening portion area is larger than a bottom area. In a bump obtained finally, therefore, an exposed surface which is exposed to the surface of the insulating resin layer 108 has a larger area than that of a connecting surface to be connected to the electrode terminal 106. For this reason, a wiring pattern led from the exposed surface of the bump 110 has a width increased and a gap between the exposed surfaces of the adjacent bumps 110 and 110 is further smaller than a gap between the adjacent electrode terminals 106 and 106 in each of the semiconductor devices 104a and 104b, and the number of the wiring patterns which can be led through the gap between the exposed surfaces of the bumps is limited still more.

SUMMARY

Exemplary embodiments of the present invention provide a semiconductor package capable of increasing a density of a wiring pattern which can be led through a gap between exposed surfaces of bumps formed on respective electrode terminals in a plurality of semiconductor devices having different thicknesses from each other and fixed to a surface of a support plate, and a method of manufacturing the semiconductor package.

The inventor made investigations to solve the problems. As a result, it was found that a plurality of semiconductor devices having different thicknesses from each other is fixed to a surface of a support plate to set terminal surfaces of electrode terminals on the level with each other and tapered bumps formed on the electrode terminals of the semiconductor devices are provided to penetrate an insulating layer covering terminal forming surfaces, at which the electrode terminals are formed, of the semiconductor devices, resulting in an increase in a density of a wiring pattern which can be led through exposed surfaces of the bumps exposed from a surface of the insulating layer. Thus, the invention has been reached.

A semiconductor package according to an exemplary embodiment of the invention comprises:

a support plate;

a plurality of semiconductor devices having different thicknesses from each other and having respective electrode terminals, the semiconductor devices fixed on a surface of the support plate through a resin layer in such a manner that terminal surfaces of the electrode terminals are on the level with each other;

an insulating layer covering terminal forming surfaces, at which the electrode terminals are formed, of the semiconductor devices;

at least one tapered bump formed on one of the terminal surfaces of the electrode terminals, the tapered bump having a tip surface formed in a smaller area than an area of the terminal surface of the electrode terminal of the semiconductor device, the tapered bump penetrating the insulating layer in such a manner that the tip surface of the tapered bump is exposed to a surface of the insulating layer; and a wiring pattern formed on the surface of the insulating layer and connected to the tip surface of the tapered bump.

A method of manufacturing a semiconductor package according to an exemplary embodiment of the invention, comprises:

a first step of preparing a plurality of semiconductor devices having different thicknesses from each other and having respective electrode terminals;

a second step of separably bonding terminal forming surfaces, at which the electrode terminals are formed, of the semiconductor devices to a surface of a plate member having a rigidity in such a manner that respective terminal surfaces of the electrode terminals are on the level with each other;

a third step of fixing an opposite surface to each of the terminal forming surfaces of the semiconductor devices through a resin layer onto a surface of a support plate, after the second step;

a fourth step of separating the plate member from the semiconductor devices to expose the terminal surfaces of the electrode terminals;

a fifth step of providing at least one tapered bump, which has a tip surface formed in a smaller area than an area of the terminal surface of the electrode terminal of the semiconductor device, on one of the exposed terminal surfaces, after the fourth step;

a sixth step of forming an insulating layer for covering each of the terminal forming surfaces of the semiconductor devices including the tapered bump; and a seventh step of polishing or grinding the insulating layer to expose the tip surface of the tapered bump; and an eight step of forming a wiring pattern to be connected to the exposed tip surface of the tapered bump.

A plurality of tapered bumps may be provided, and the tapered bumps may be formed on all of the electrode terminals of the semiconductor devices. It is possible to increase the density of the wiring pattern which can be led through the gap between the exposed surfaces of the bumps over all of the electrode terminals in the respective semiconductor devices.

The semiconductor package may further comprise at least one columnar bump formed on the terminal surface of the electrode terminal which is different from the electrode terminal on which the tapered bump is formed. The semiconductor package may further comprise at least one columnar bump formed on the terminal surface of the electrode terminal on which the tapered bump is formed. Moreover, it is possible to form an optimum bump depending on uses of the electrode terminal, for example, to form a tapered bump on an electrode terminal for a signal and a columnar bump on an electrode terminal for a power supply or a ground.

The tapered bump may be provided by carrying out coining over a tip portion formed by tearing a metal wire having an end which is contact bonded to the electrode terminal of the semiconductor device.

The tapered bump may be formed by a wire constituted by gold.

The support plate may be a metal support plate which can be used as a radiating plate.

In the invention, the semiconductor devices having the different thicknesses from each other are fixed to a surface of the support plate in such a manner that the terminal surfaces of the electrode terminals are on the level with each other. Therefore, the bump having an equal length and penetrating the insulating layer covering the terminal forming surfaces of the semiconductor devices having the different thicknesses from each other can be formed on the terminal surface of each of the electrode terminals in the semiconductor devices. As compared with the case in which the bumps having different lengths from each other are formed on the terminal surface of each of the electrode terminals in the semiconductor devices, thus, it is possible to form the bump more easily.

In addition, in the semiconductor package according to the invention, the tip surface of the tapered bump which is formed on the terminal surface of the electrode terminal of the semiconductor device is exposed to the surface of the insulating layer and is connected to the wiring pattern. The tip surface of the tapered bump can be formed to have a smaller area than that of the terminal surface of the electrode terminal in the semiconductor device.

Accordingly, the bump having the equal length and penetrating the insulating layer covering the terminal forming surfaces of the semiconductor devices having the different thicknesses from each other can be formed on the terminal surfaces of the electrode terminals in the semiconductor devices, and furthermore, a fine wiring pattern can be led from the exposed surface of the bump and an interval between the exposed surfaces of the bumps can be increased. Therefore, it is possible to increase a density of the wiring pattern which can be led through a gap between the exposed surfaces of the bumps.

As a result, it is possible to cope with an increase in a density of the electrode terminal in the semiconductor device with a reduction in a size of the semiconductor device.

Other features and advantages may be apparent from the following detailed description, the accompanying drawings and the claims.

BRIEF DESCRIPTION OF THE DRAWINGS

FIGS. 2A to 3E show views for explaining manufacturing processes of the semiconductor package shown in FIG. 1.

DETAILED DESCRIPTION

Figure 1:
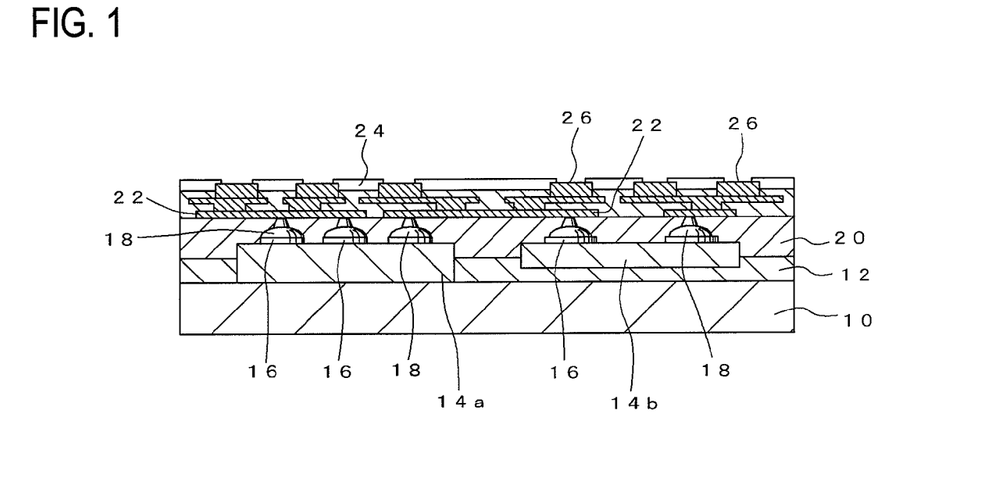
FIG. 1 shows an longitudinal sectional view of a semiconductor package according to an exemplary embodiment of the invention.

FIG. 1 shows an exemplary embodiment of a semiconductor package according to the invention. In the semiconductor package shown in FIG. 1, semiconductor devices 14a and 14b are fixed, through a resin layer 12, to a surface of a support plate 10 which is formed of a metal having a high thermal conductivity, for example, iron, copper or aluminum and can serve as a radiating plate. The semiconductor devices 14a and 14b have different thicknesses from each other and are positioned in such a manner that terminal surfaces of electrode terminals 16 and 16 formed on the semiconductor devices 14a and 14b are on the level with each other.

An insulating layer 20 is formed by a resin and covers terminal forming surfaces of the semiconductor devices 14a and 14b. The terminal forming surface is a surface at which the electrode terminal 16 is formed of the semiconductor device. A tapered bump 18 is formed on each of the terminal surfaces of the electrode terminals 16 and 16 to penetrate the insulating layer 20. The tapered bump 18 is formed as follows. As will be described below, an end of a gold wire is contact bonded to the terminal surface of the electrode terminal 16 and a tip portion formed by tearing the gold wire is then subjected to coining to flatten a tip surface and to make a uniform height.

Tip surfaces of the bumps 18 and 18 are exposed to a surface of the insulating layer 20 and have a smaller exposing area than that of the terminal surface of the electrode terminal 16 to which the other end of the bump 18 is connected. Therefore, a wiring pattern 22 formed on the surface of the insulating layer 20 and led from each of the tip surfaces of the tapered bumps 18 and 18 can be caused to be finer than the terminal surface of the electrode terminal 16.

Accordingly, it is possible to lead the wiring pattern 22 from the tip surface of the tapered bump 18 formed on the electrode terminal 16 and to increase a gap between exposed surfaces of the adjacent bumps 18 and 18 (a gap between exposed surfaces of bumps). Therefore, it is possible to increase a density of the wiring pattern which can be led through the gap between the exposed surfaces of the bumps. Thus, it is possible to cope with an increase in a density of the electrode terminals 16 and 16 of the semiconductor devices 14a and 14b.

As shown in FIG. 1, it is also possible to stack a plurality of wiring patterns in a multilayer on the wiring patterns 22 and 22 through an insulating layer if necessary and to electrically connect the wiring patterns 22 and 22 through a via penetrating the insulating layer.

Moreover, a solder resist layer 24 is formed on an uppermost layer of the semiconductor package shown in FIG. 1, and pads 26 and 26 for attaching a solder ball to be an external connecting terminal are exposed from the solder resist layer 24. The pads 26 and 26 can also be provided with an optional electronic component such as a chip capacitor, a resistor or an inductor.

In the semiconductor package shown in FIG. 1, it is possible to electrically connect the electrode terminals 16 of the semiconductor devices 14a and 14b which are provided through the wiring pattern 22 connected to the exposed surfaces of the bumps 18 and 18.

In the semiconductor package shown in FIG. 1, a metal support plate having a high thermal conductivity is used as the support plate 10 in such a manner that it can serve as a radiating plate. In the case in which a role of the support plate 10 as the radiating plate does not need to be considered, however, it is possible to use a support plate which is formed by a glass plate or a silicon plate.

Figure 2A:
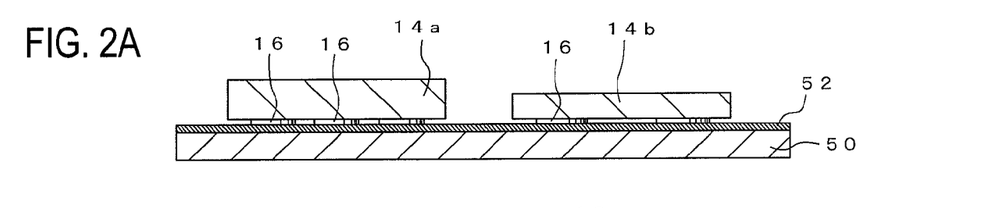

The semiconductor package shown in FIG. 1 can be manufactured by a manufacturing method illustrated in FIGS. 2A to 3E. First of all, as shown in FIG. 2A, the semiconductor devices 14a and 14b having different thicknesses from each other and having the electrode terminals 16 and 16 are prepared. Terminal forming surfaces, at which the electrode terminals 16 and 16 are formed, of the semiconductor devices 14a and 14b are separably bonded to a surface of a plate member 50 through a bonding layer 52. The bonding layer 52 is used for temporarily fixing the semiconductor devices 14a and 14b, and thus, an adhesion force of the bonding layer 52 is weaker than an adhesion force of the resin layer 12. The plate member 50 has a rigidity and is, for example, a glass plate. In this case, positions of the semiconductor devices 14a and 14b are adjusted in such a manner that respective terminal surfaces of the electrode terminals 16 and 16 formed on the semiconductor devices 14a and 14b are on the level with each other.

Figure 2B:
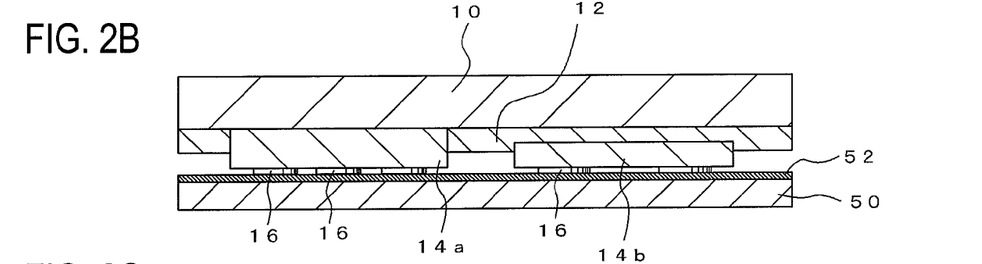

As shown in FIG. 2B, furthermore, opposite surfaces to the terminal forming surfaces of the semiconductor devices 14a and 14b are fixed through the resin layer 12 (which is made of an epoxy resin or a polyimide resin, for example) formed on a the surface of the support plate 10.

Figure 2C:
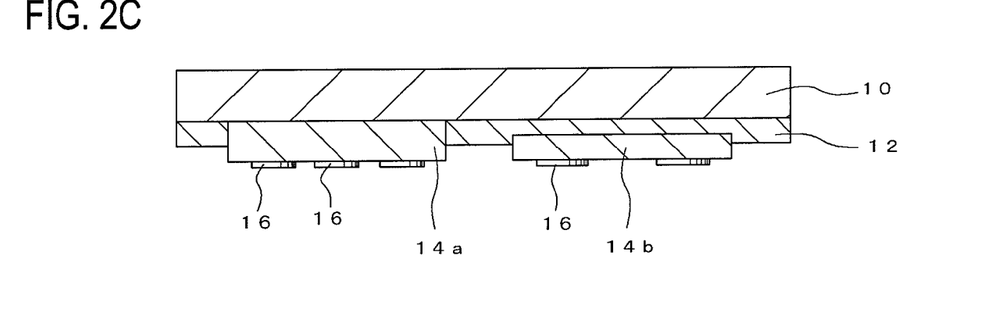

Next, the plate member 50 and the bonding layer 52 are separated so that the electrode terminals 16 and 16 of the semiconductor devices 14a and 14b fixed to the surface of the support plate 10 through the resin layer 12 are exposed as shown in FIG. 2C. The respective terminal surfaces of the electrode terminals 16 and 16 thus exposed can be set on the level with each other even if the semiconductor devices 14a and 14b have different thicknesses from each other.

Figure 3A:
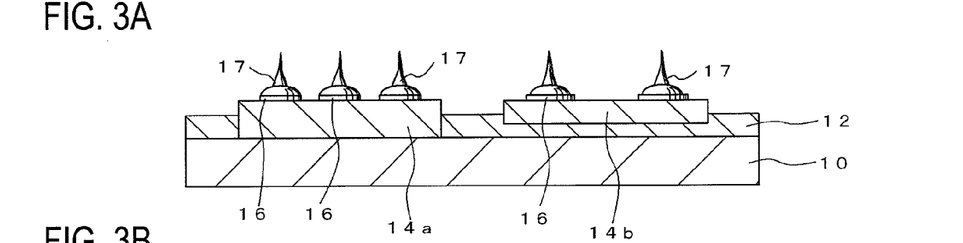

As shown in FIG. 3A, a bump 17 having a slender tip portion is formed on each of the terminal surfaces of the electrode terminals 16 and 16 of the semiconductor devices 14a and 14b illustrated in FIG. 2C. The bump 17 is formed by contact bonding an end of a gold wire to the terminal surface of the electrode terminal 16 and then tearing the gold wire. The bump 17 can be formed by a bonding device used for manufacturing a semiconductor device.

Figure 3B:
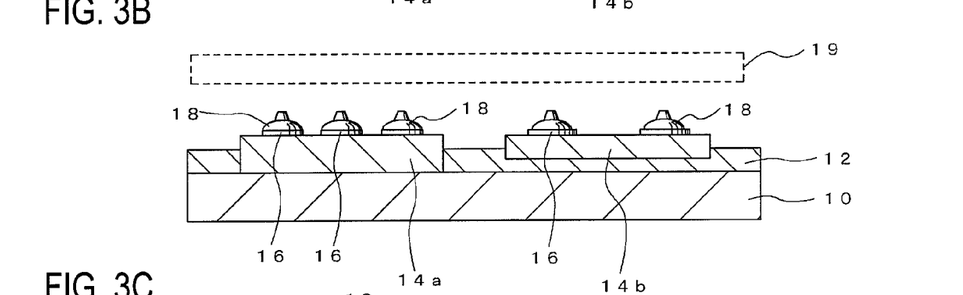

In the bumps 17 and 17 shown in FIG. 3A, tip portions are subjected to coining through a coining plate (metal mold) 19 and are thus flattened as illustrated in FIG. 3B. Consequently, the tapered bumps 18 and 18 are formed. Each of tip surfaces of the tapered bumps 18 and 18 has a smaller area than that of the terminal surface of the electrode terminal 16 and has an equal height and an almost equal area.

Figure 3C:
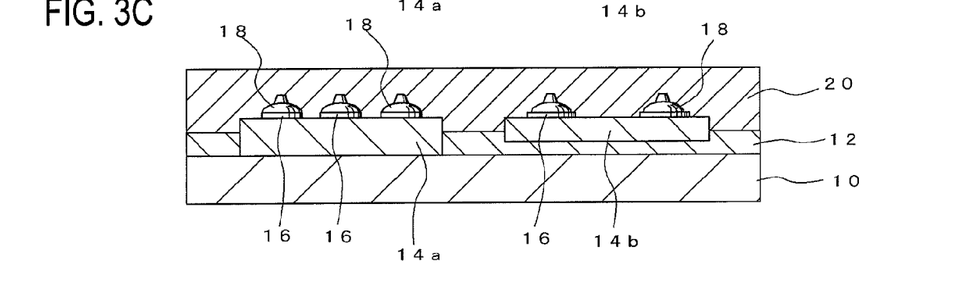

Subsequently, the respective terminal forming surfaces of the semiconductor devices 14a and 14b including the tapered bumps 18 and 18 which are formed are covered with the insulating layer 20 constituted by an insulating resin as shown in FIG. 3C. The insulating layer 20 can be formed by applying an insulating resin such as an epoxy resin or a polyimide resin or laminating a film constituted by the insulating resins.

Figure 3D:
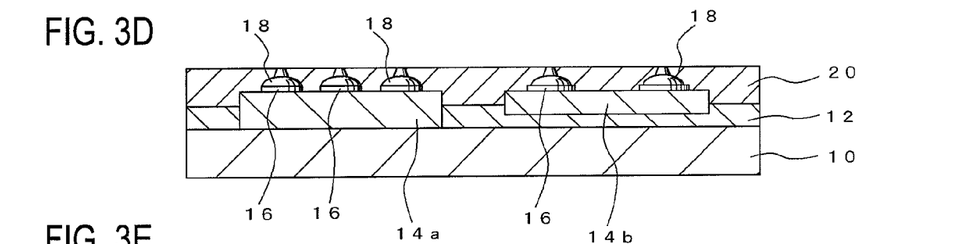

The insulating layer 20 is subjected to polishing or grinding to expose the respective tip surfaces of the tapered bumps 18 and 18 as shown in FIG. 3D.

Figure 3E:
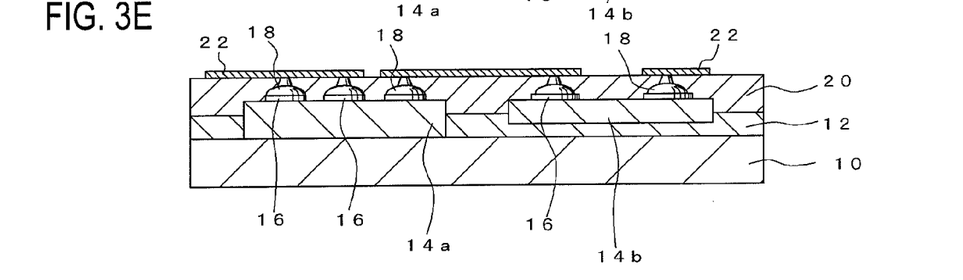

Then, the wiring patterns 22 and 22 to which the exposed tip surfaces of the tapered bumps 18 and 18 are to be connected are formed on a surface of the insulating layer 20. For example, the wiring patterns 22 and 22 are formed by a well-known semiadditive method using copper plating. The tip surfaces of the tapered bumps 18 and 18 which are exposed to the surface of the insulating layer 20 can be formed in smaller areas than those of the terminal surfaces of the electrode terminals 16 and 16 which are formed on the semiconductor devices 14a and 14b. Therefore, the wiring pattern 22 can be formed to have a smaller width than that of the terminal surface of the electrode terminal 16 on which the tapered bump 18 to be connected is provided. Thus, it is possible to form the wiring pattern 22 which is made fine.

Moreover, the gap between the exposed surfaces of the adjacent bumps 18 and 18 can be set to be greater than a gap between the terminal surfaces of the electrode terminals 16 and 16 on which the bumps 18 and 18 are formed.

Accordingly, it is possible to increase a density of the wiring patterns 22 and 22 led from the gap between the exposed surfaces of the bumps and to cope with an increase in a density of the electrode terminals 16 and 16 depending on a reduction in sizes of the semiconductor devices 14a and 14b.

A plurality of wiring patterns is stacked in a multilayer on the wiring patterns 22 and 22 through an insulating layer if necessary and is electrically connected to each other through a via penetrating the insulating layer. Consequently, it is possible to obtain the semiconductor package shown in FIG. 1.

When stacking the wiring patterns in the multilayer on the wiring patterns 22 and 22 through the insulating layer, thus, it is possible to utilize a well-known additive method or semi-additive method.

In the semiconductor package shown in FIGS. 1 to 3E, the tapered bumps 18 are formed on the terminal surfaces of all of the electrode terminals 16 of the semiconductor devices 14a and 14b mounted on the surface of the support plate 10. As in a semiconductor package shown in FIG. 4, however, it is also possible to form the tapered bump 18 on the terminal surfaces of the electrode terminals 16 and 16 of the semiconductor device 14a and to form a columnar bump 30 on the terminal surfaces of the electrode terminals 16 and 16 of the semiconductor device 14b.

Figure 4:
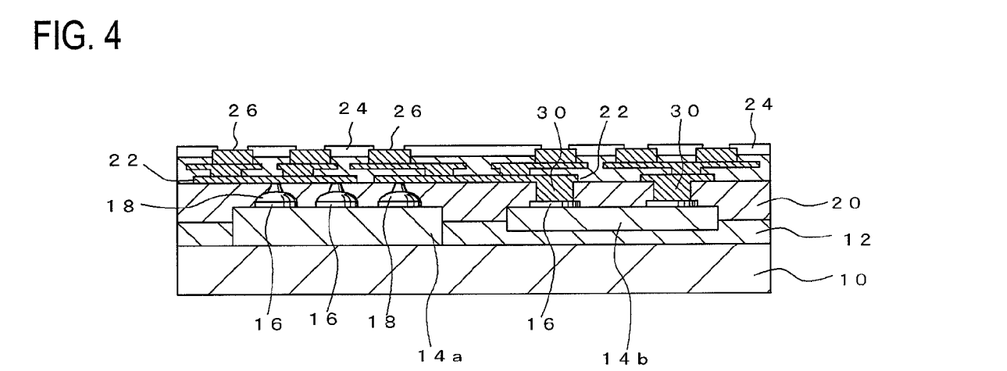
FIG. 4 shows e longitudinal sectional view of a semiconductor package according to an exemplary another embodiment of the invention.

In the semiconductor device 14b of the semiconductor package shown in FIG. 4, a forming density of the electrode terminals 16 and 16 is not increased. Even if the columnar bump 30 is formed, it is possible to easily form the wiring pattern 22 to be connected to the bump 30.

By forming the tapered bump 18 and the columnar bump 30 together, thus, it is possible to form an optimum bump depending on respective uses of the electrode terminals 16 and 16, for example, the tapered bump 18 on an electrode terminal for a signal and the columnar bump 30 on an electrode terminal for a power supply or a ground.

As shown in FIG. 4, when the semiconductor package formed by mixing the tapered bump 18 and the columnar bump 30 is to be manufactured, the respective terminal surfaces of the electrode terminals 16 and 16 of the semiconductor devices 14a and 14b fixed to the surface of the support plate 10 through the resin layer 12 are exposed in the same manner as in the steps illustrated in FIGS. 2A to 2C.

The tapered bump 18 is formed on the respective terminal surfaces of the electrode terminals 16 and 16 of the semiconductor device 14a in the same manner as in the steps shown in FIGS. 3A and 3B. In this case, any bump is not formed on the respective terminal surfaces of the electrode terminals 16 and 16 of the semiconductor device 14b.

Figure 5A:
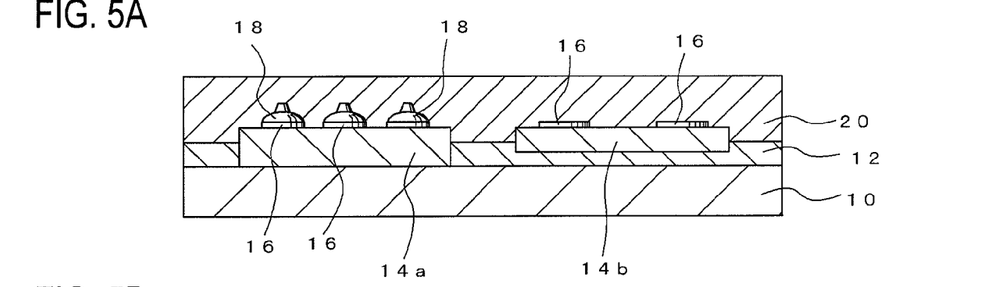
FIGS. 5A to 5D show views for explaining manufacturing processes of the semiconductor package shown in FIG. 5.
Figure 5B:
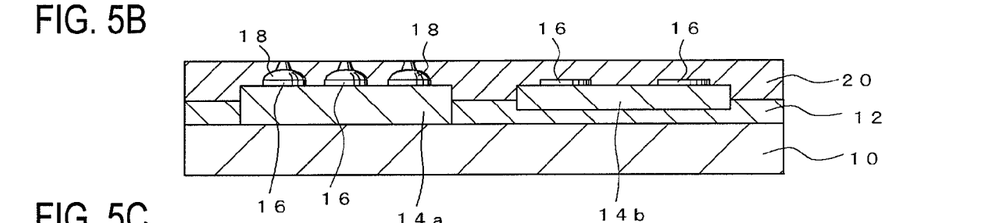

As shown in FIG. 5A, next, respective terminal forming surfaces of the semiconductor devices 14a and 14b which include the bump 18 formed on the terminal surface of the electrode terminal 16 of the semiconductor device 14a are covered with the insulating layer 20 formed by an insulating resin. As shown in FIG. 5B, then, the insulating layer 20 is subjected to polishing or grinding to expose respective tip surfaces of the tapered bumps 18 and 18 formed on the semiconductor device 14.

Figure 5C:
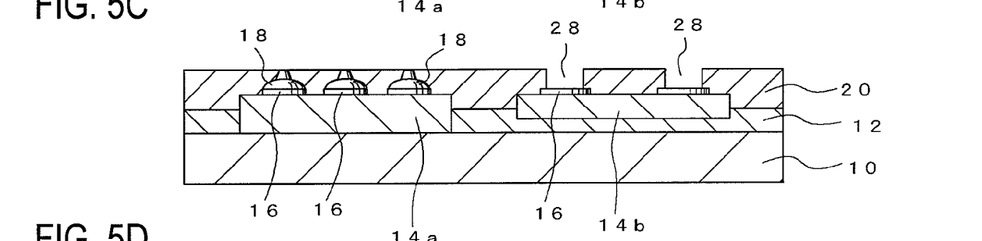

As shown in FIG. 5C, furthermore, concave portions 28 and 28 are formed by a laser in order to expose the respective terminal surfaces of the electrode terminals 16 and 16 of the semiconductor device 14b to its bottom face.

Figure 5D:
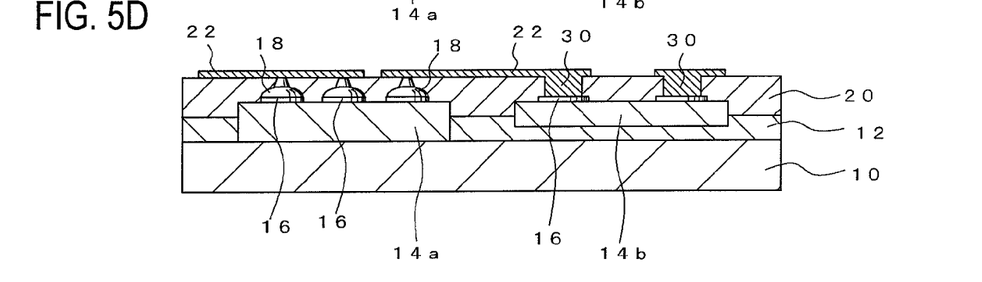

As shown in FIG. 5D, thereafter, the concave portions 28 and 28 are filled with a plating metal to form the columnar bump 30 and to form the wiring patterns 22 and 22 to be connected to the tip surface of the tapered bump 18 and the columnar bump 30 respectively.

When the columnar bump 30 and the wiring patterns 22 and 22 are to be formed, a thin metal layer (for example, a thin copper layer) is provided over a whole surface of the insulating layer 20 including each of internal wall surfaces of the concave portions 28 and 28 shown in FIG. 5C by electroless plating, deposition or sputtering, for example.

In addition, a photosensitive resin layer formed on a surface of the thin metal layer is subjected to patterning in such a manner that the thin metal layer is exposed along a wiring pattern to be formed. Subsequently, electrolytic plating using the thin metal layer as a feeding layer is carried out to fill the concave portions 28 and 28 with a plating metal (for example, copper) and to form the wiring patterns 22 and 22.

Next, the photosensitive resin layer is peeled and the exposed thin metal layer is subjected to etching so that it is possible to form the columnar bump 30 and the wiring patterns 22 and 22 which are shown in FIG. 5D.

A plurality of wiring patterns is stacked in a multilayer on the wiring patterns 22 and 22 through an insulating layer if necessary and is electrically connected to each other through a via penetrating the insulating layer. Consequently, it is possible to obtain the semiconductor package shown in FIG. 4.

When the wiring patterns are stacked in the multilayer on the wiring patterns 22 and 22 through the insulating layer, thus, it is possible to utilize a well-known additive method or semiadditive method.

Although the columnar bump 30 is formed on only the semiconductor device 14b in FIGS. 4 to 5D, it is also possible to mix the tapered bump 18 and the columnar bump 30 on at least one of the semiconductor devices 14a and 14b.

In the semiconductor packages shown in FIGS. 1 to 5D, the semiconductor devices 14a and 14b having different thicknesses from each other are fixed to the surface of the support plate 10 in such a manner that the terminal surfaces of the electrode terminals 16 and 16 are on the level with each other. Therefore, it is possible to form bumps having an equal length on the respective terminal surfaces of the electrode terminals 16 and 16 of the semiconductor devices 14a and 14b. Thus, it is possible to form a bump more easily as compared with the case in which the lengths of the bumps formed on the terminal surfaces of the electrode terminals 16 and 16 of the semiconductor device 14a and the electrode terminals 16 and 16 of the semiconductor device 14b are different from each other.

In the semiconductor packages shown in FIGS. 1 to 5D, moreover, the tapered bump 18 is formed on the respective terminal surfaces of the electrode terminals 16 and 16 of at least one of the semiconductor devices 14a and 14b. Therefore, the area of the tip surface of the tapered bump 18 which is exposed to the surface of the insulating layer 20 can be set to be smaller than that of the terminal surface of the electrode terminal 16 so that the wiring pattern 22 to be connected to the tip surface of the tapered bump 18 can be made fine, and furthermore, the gap between the exposed surfaces of the adjacent bumps 18 and 18 can be set to be greater than the gap between the terminal surfaces of the electrode terminals 16 and 16 on which the bumps 18 and 18 are formed.

In the semiconductor packages shown in FIGS. 1 to 5D, it is possible to increase the density of the wiring patterns 22 and 22 led through the gap between the exposed surfaces of the adjacent bumps 18 and 18 and to cope with an increase in the density of the electrode terminals 16 and 16 with a reduction in the sizes of the semiconductor devices 14a and 14b.

Although the description has been given to the example in which only the semiconductor device is provided in the semiconductor packages shown in FIGS. 1 to 5D, it is possible to provide a capacitor, a resistor or an inductor, for example, together with the semiconductor device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A semiconductor package comprising:
a support plate;
a plurality of semiconductor devices having different thicknesses from each other and having respective electrode terminals, the semiconductor devices fixed on a surface of the support plate through a resin layer in such a manner that terminal surfaces of the electrode terminals are on the level with each other;
an insulating layer formed on terminal forming surfaces, at which the electrode terminals are formed, of the semiconductor devices;
at least one tapered bump formed on one of the terminal surfaces of the electrode terminals, the tapered bump having a tip surface formed in a smaller area than an area of the terminal surface of the electrode terminal, the tapered bump penetrating through the insulating layer in such a manner that the tip surface of the tapered bump is exposed through the insulating layer to a surface of the insulating layer; and
a wiring pattern formed on the surface of the insulating layer and connected to the tip surface of the tapered bump, thereby allowing for increased wiring pattern density.

2. The semiconductor package according to claim 1, wherein a plurality of tapered bumps are provided, and the tapered bumps are formed on all of the electrode terminals of the semiconductor devices.

3. A semiconductor package comprising:
a support plate;
a plurality of semiconductor devices having different thicknesses from each other and having respective electrode terminals, the semiconductor devices fixed on a surface of the support plate through a resin layer in such a manner that terminal surfaces of the electrode terminals are on the level with each other;
an insulating layer covering terminal forming surfaces, at which the electrode terminals are formed, of the semiconductor devices;
at least one tapered bump formed on one of the terminal surfaces of the electrode terminals, the tapered bump having a tip surface formed in a smaller area than an area of the terminal surface of the electrode terminal, the tapered bump penetrating the insulating layer in such a manner that the tip surface of the tapered bump is exposed to a surface of the insulating layer;
a wiring pattern formed on the surface of the insulating layer and connected to the tip surface of the tapered bump; and
at least one columnar bump formed on the terminal surface of the electrode terminal which is different from the electrode terminal on which the tapered bump is formed.

4. The semiconductor package according to claim 1, further comprising:
at least one columnar bump formed on the terminal surface of the electrode terminal on which the tapered bump is formed.

5. The semiconductor package according to claim 1, wherein the tapered bump is provided by carrying out coining over a tip portion formed by tearing a metal wire having an end which is contact bonded to the electrode terminal of the semiconductor device.

6. The semiconductor package according to claim 1, wherein the tapered bump is formed by a wire constituted by gold.

7. The semiconductor package according to claim 1, wherein the support plate is a metal support plate which can be used as a radiating plate.

8. The semiconductor package according to claim 1, wherein the resin layer is disposed between a bottom surface of the semiconductor device having a small thickness and the support plate, and a bottom surface of the semiconductor device having a large thickness is directly in contact with the support plate.

9. The semiconductor package according to claim 1, wherein a height of the resin layer disposed between a bottom surface of the semiconductor device having a small thickness and the support plate is higher than a height of the resin layer disposed between a bottom surface of the semiconductor device having a large thickness and the support plate.

10. The semiconductor package according to claim 1, wherein the insulating layer is formed so as to be in contact with the terminal forming surfaces and at least a part of the side surfaces of the semiconductor devices.

* * * * *